(12) United States Patent
Jung et al.

(10) Patent No.: US 9,069,132 B2
(45) Date of Patent: Jun. 30, 2015

(54) PHOTOSENSITIVE RESIN COMPOSITION FOR LIGHT BLOCKING LAYER AND LIGHT BLOCKING LAYER USING THE SAME

(71) Applicant: Cheil Industries Inc., Gumi-si (KR)

(72) Inventors: Ju-Ho Jung, Uiwang-si (KR); Ji-Hye Kim, Uiwang-si (KR); Kyung-Won Ahn, Uiwang-si (KR); A-Rum Yu, Uiwang-si (KR); Jae-Bum Yim, Uiwang-si (KR); Hwan-Sung Cheon, Uiwang-si (KR); Hyun-Moo Choi, Gunpo-si (KR)

(73) Assignee: Cheil Industries Inc., Gumi-si (KR)

( * ) Notice: Subject to any disclaimer, the term of this patent is extended or adjusted under 35 U.S.C. 154(b) by 80 days.

(21) Appl. No.: 13/904,067

(22) Filed: May 29, 2013

(65) Prior Publication Data
US 2014/0178815 A1   Jun. 26, 2014

(30) Foreign Application Priority Data

Dec. 26, 2012   (KR) .................. 10-2012-0153565

(51) Int. Cl.
| | | |
|---|---|---|
| G03F 1/00 | (2012.01) | |
| G03F 7/00 | (2006.01) | |
| G02B 5/20 | (2006.01) | |
| G03F 7/032 | (2006.01) | |
| G03F 7/028 | (2006.01) | |

(52) U.S. Cl.
CPC ............... *G02B 5/201* (2013.01); *G03F 7/032* (2013.01); *G03F 7/028* (2013.01); *G03F 7/0007* (2013.01)

(58) Field of Classification Search
USPC ........................ 430/281.1, 7, 270.1
See application file for complete search history.

(56) References Cited

U.S. PATENT DOCUMENTS

| | | | |
|---|---|---|---|
| 5,278,009 A | 1/1994 | Iida et al. | |
| 5,663,019 A | 9/1997 | Matsumura et al. | |
| 5,811,209 A | 9/1998 | Eida et al. | |
| 5,998,091 A | 12/1999 | Suzuki | |
| 6,183,917 B1 * | 2/2001 | Sakamoto et al. | 430/7 |
| 6,589,672 B1 * | 7/2003 | Kobayashi et al. | 428/690 |
| 6,733,935 B2 | 5/2004 | Kishimoto et al. | |
| 6,826,001 B2 | 11/2004 | Funakura et al. | |
| 7,601,764 B2 | 10/2009 | Wu et al. | |
| 7,618,486 B2 | 11/2009 | Lee et al. | |
| 7,749,664 B2 * | 7/2010 | Suzuki et al. | 430/7 |
| 8,153,706 B2 | 4/2012 | Vasudevan | |
| 8,617,796 B2 | 12/2013 | Lee et al. | |
| 8,735,025 B2 * | 5/2014 | Kim et al. | 430/7 |
| 2002/0045112 A1 | 4/2002 | Kishimoto et al. | |
| 2002/0172873 A1 | 11/2002 | Ueda et al. | |
| 2004/0157140 A1 | 8/2004 | Kamata et al. | |
| 2004/0191679 A1 | 9/2004 | Shibuya | |
| 2005/0175930 A1 * | 8/2005 | Lee | 430/270.1 |
| 2006/0051685 A1 | 3/2006 | Fujimori et al. | |
| 2006/0100298 A1 | 5/2006 | Ulrich et al. | |
| 2006/0257762 A1 | 11/2006 | Fujimori et al. | |
| 2006/0275676 A1 | 12/2006 | Yamada | |
| 2007/0287086 A1 | 12/2007 | Shinada et al. | |
| 2008/0160432 A1 | 7/2008 | Byon et al. | |
| 2008/0220372 A1 * | 9/2008 | Lee et al. | 430/281.1 |
| 2008/0286688 A1 | 11/2008 | Koyanagi et al. | |
| 2009/0029120 A1 | 1/2009 | Fujii et al. | |
| 2009/0202948 A1 | 8/2009 | Simpson et al. | |
| 2009/0280416 A1 * | 11/2009 | Einaga et al. | 430/7 |
| 2009/0291236 A1 * | 11/2009 | Sasada et al. | 428/1.1 |
| 2010/0104958 A1 | 4/2010 | Jeong et al. | |
| 2010/0104981 A1 * | 4/2010 | Choi et al. | 430/286.1 |
| 2010/0243970 A1 | 9/2010 | Toshimitsu et al. | |
| 2012/0138858 A1 * | 6/2012 | Lee et al. | 252/301.35 |
| 2012/0243099 A1 * | 9/2012 | Kaneko | 359/611 |

FOREIGN PATENT DOCUMENTS

| | | |
|---|---|---|
| CN | 1188908 A | 7/1998 |
| CN | 1460192 A | 12/2003 |
| CN | 1656127 | 8/2005 |
| CN | 1782748 A | 6/2006 |

(Continued)

OTHER PUBLICATIONS

Korean Office Action in commonly owned Korean Patent Application No. 10-2006-0136211, dated Jun. 18, 2008, pp. 1-4.
English translation of Korean Office Action in commonly owned Korean Patent Application 10-2006-0136211, dated Jun. 18, 2009, 1-2.
Chinese Office Action in commonly owned Chinese Application No. 200710302350.3 dated Jul. 29, 2011, pp. 1-6.
English translation of Chinese Office Action in commonly owned Chinese Application No. 200710302350.3 dated Jul. 29, 2011, pp. 1-11.
Office Action in commonly owned U.S. Appl. No. 11/949,114 mailed Aug. 19, 2010, pp. 1-11.
Final Office Action in commonly owned U.S. Appl. No. 11/949,114 mailed Feb. 3, 2011, pp. 1-9.

(Continued)

*Primary Examiner* — Amanda C Walke
(74) *Attorney, Agent, or Firm* — Additon, Higgins & Pendleton, P.A.

(57) ABSTRACT

A photosensitive resin composition for a light blocking layer includes (A) a colorant including a blue material including a dye represented by the following Chemical Formula 1, and a red material, (B) a binder resin, (C) a photopolymerizable monomer, (D) a photopolymerization initiator, and (E) a solvent, and a light blocking layer using the same.

[Chemical Formula 1]

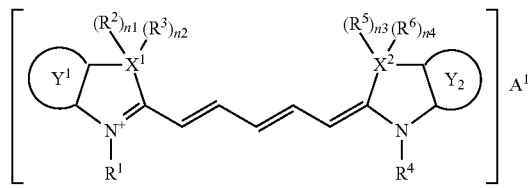

In Chemical Formula 1, each substituent is the same as defined in the detailed description.

10 Claims, No Drawings

(56) References Cited

FOREIGN PATENT DOCUMENTS

| | | |
|---|---|---|
| CN | 1896873 | 1/2007 |
| CN | 101517493 | 8/2009 |
| EP | 0337951 | 10/1989 |
| EP | 0628599 | 7/1994 |
| EP | 0725315 | 8/1996 |
| JP | 2552391 A | 7/1992 |
| JP | 07-140654 | 6/1995 |
| JP | 7-172032 | 7/1995 |
| JP | 08-179120 | 7/1996 |
| JP | 08211219 A | 8/1996 |
| JP | 09-203806 | 8/1997 |
| JP | 10-254133 | 9/1998 |
| JP | 2000-075475 A | 3/2000 |
| JP | 2000-309726 | 11/2000 |
| JP | 2002-047423 A | 2/2002 |
| JP | 2002-309118 | 10/2002 |
| JP | 2003-003109 | 1/2003 |
| JP | 2003-161828 A | 6/2003 |
| JP | 2003-167113 A | 6/2003 |
| JP | 2004-341121 | 12/2004 |
| JP | 2007-071994 A | 3/2007 |
| JP | 2009-299076 | 12/2009 |
| KR | 10-1991-0004717 B1 | 7/1991 |
| KR | 10-1992-7002502 | 9/1992 |
| KR | 10-1993-7000858 | 3/1993 |
| KR | 10-1994-0005617 B1 | 6/1994 |
| KR | 10-1994-0007778 | 8/1994 |
| KR | 10-1995-7000359 | 1/1995 |
| KR | 10-1995-0011163 B1 | 9/1995 |
| KR | 10-1995-7003746 | 9/1995 |
| KR | 10-1996-0011513 | 4/1996 |
| KR | 10-1996-0029904 | 8/1996 |
| KR | 10-2001-0014409 | 2/2001 |
| KR | 10-2001-0024701 A | 3/2001 |
| KR | 10-2004-0095670 | 11/2004 |
| KR | 10-2005-0069024 A | 7/2005 |
| KR | 10-2005-0070619 | 7/2005 |
| KR | 2006-0052171 | 5/2006 |
| KR | 10-2006-0077971 A | 7/2006 |
| KR | 10-2006-0096882 A | 9/2006 |
| KR | 10-2007-0114005 A | 11/2007 |
| KR | 10-2008-0036351 | 4/2008 |
| KR | 10-2008-0055111 A | 6/2008 |
| KR | 10-2010-0055356 A | 5/2010 |
| KR | 10-2011-0079198 A | 7/2011 |
| KR | 10-2012-0105576 A | 9/2012 |
| TW | 201037458 | 10/2010 |
| WO | 2005/071489 A1 | 8/2005 |
| WO | 2006/037728 A1 | 4/2006 |

OTHER PUBLICATIONS

Final Office Action in commonly owned U.S. Appl. No. 11/949,114 mailed May 16, 2011, pp. 1-9.
Advisory Action in commonly owned U.S. Appl. No. 11/949,114 mailed Aug. 22, 2011, pp. 1-3.
Office Action in commonly owned U.S. Appl. No. 11/965,134 mailed Sep. 20, 2011, pp. 1-10.
Final Office Action in commonly owned U.S. Appl. No. 11/965,134 mailed Jan. 3, 2012, pp. 1-10.
Office Action in commonly owned U.S. Appl. No. 11/965,134 mailed Apr. 6, 2012, pp. 1-9.
Office Action in commonly owned U.S. Appl. No. 12/582,005 mailed Apr. 25, 2012, pp. 1-7.
Chinese Search Report in commonly owned Chinese Application No. 2011102380054 dated Nov. 22, 2012, pp. 1-2.
Chinese Search Report in commonly owned Chinese Application No. 201110238005.4 dated Aug. 19, 2013, pp. 1-2.
English translation of Chinese Search Report in commonly owned Chinese Application No. 201110238005.4 dated Aug. 19, 2013, pp. 1-2.
Taiwanese Search Report in commonly owned Taiwanese Application No. 100125290 dated Aug. 28, 2013, pp. 1-2.
JP 08211219 A, Aug. 1996, Machine Translation, pp. 1-15.

* cited by examiner

PHOTOSENSITIVE RESIN COMPOSITION FOR LIGHT BLOCKING LAYER AND LIGHT BLOCKING LAYER USING THE SAME

CROSS-REFERENCE TO RELATED APPLICATION

This application claims priority to and the benefit of Korean Patent Application No. 10-2012-0153565 filed in the Korean Intellectual Property Office on Dec. 26, 2012, the entire disclosure of which is incorporated herein by reference.

FIELD

This disclosure relates to a photosensitive resin composition for a light blocking layer and a light blocking layer using the same.

BACKGROUND

A photosensitive resin composition for a light blocking layer is a material used to fabricate a display device such as a light blocking layer, a liquid crystal display material, an organic light emitting element (EL), a display panel material, and the like. For example, a photosensitive resin composition for a light blocking layer can be used to form a light blocking layer for a color liquid crystal display and the like. The light blocking layer is formed between colored layers such as red, green, blue, and the like to increase display contrast or chromophore effects.

However, a currently-used carbon pigment dispersion-type photosensitive composition has low electrical resistance and thus, may not be used as a photo spacer or an insulating material. Accordingly, Japanese Patent No. 2,552,391 discloses a photosensitive composition prepared by using an insulating organic pigment including an organic pigment mixture instead of carbon black to provide high insulation like a photo spacer and simultaneously, realize blackness. However, the photosensitive composition includes only an organic pigment and thus, decreases optical density (OD).

SUMMARY

One embodiment provides a photosensitive resin composition for a light blocking layer that can prevent elution of metal ions and can provide excellent lightproof properties.

Another embodiment provides a light blocking layer manufactured using the photosensitive resin composition for a light blocking layer.

According to one embodiment, provided is a photosensitive resin composition for a light blocking layer that includes (A) a colorant including a blue material including a dye represented by the following Chemical Formula 1 and a red material; (B) a binder resin; (C) a photopolymerizable monomer; (D) a photopolymerization initiator; and (E) a solvent.

[Chemical Formula 1]

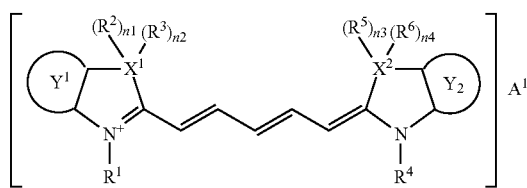

In Chemical Formula 1,
$X^1$ and $X^2$ are the same or different and are each independently a carbon atom, a sulfur atom, or an oxygen atom,
$R^1$ to $R^6$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl,
the $Y^1$ cyclic group and $Y^2$ cyclic group are the same or different and are each independently substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl,
$A^1$ is a halide anion, a perhalate anion, a tetrafluoroborate anion ($BF_4^-$), a hexafluoroantimonate anion ($SbF_6^-$), a haloacetate anion, an alkylsulfate anion, a sulfonate anion, or a hexafluorophosphate anion ($PF_6^-$), and
$n^1$ to $n^4$ are the same or different and are each independently 0 or 1.
The dye represented by Chemical Formula 1 may be a dye represented by the following Chemical Formula 2.

[Chemical Formula 2]

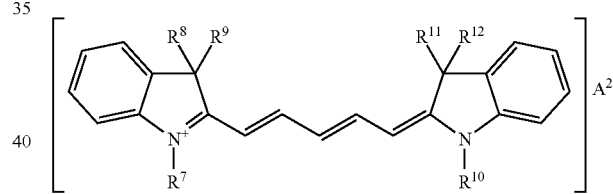

In Chemical Formula 2,
$R^7$ to $R^{12}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, and
$A^2$ is a halide anion, a perhalate anion, a tetrafluoroborate anion ($BF_4^-$), a hexafluoroantimonate anion ($SbF_6^-$), a haloacetate anion, an alkylsulfate anion, a sulfonate anion, or a hexafluorophosphate anion ($PF_6^-$).
The blue material may further include a violet pigment.
The red material may include a dye, a pigment, or a combination thereof.
The red material may include a perylene-based pigment, an anthraquinone-based pigment, a dianthraquinone-based pigment, an azo-based pigment, a diazo-based pigment, a quinacridone-based pigment, an anthracene-based pigment, or a combination thereof.

The colorant may include the blue material and the red material in a weight ratio of about 10:90 to about 90:10.

The colorant may further include a green material.

The green material may include a dye, a pigment, or a combination thereof.

The green material may include a halogenated phthalocyanine-based pigment.

The photosensitive resin composition for a light blocking layer may include about 1 to about 80 wt % of the colorant (A); about 0.1 to about 30 wt % of the binder resin (B); about 0.1 to about 30 wt % of the photopolymerizable monomer (C); about 0.1 to about 5 wt % of the photopolymerization initiator (D); and a balance amount of the solvent (E).

According to another embodiment, a light blocking layer manufactured using the photosensitive resin composition for a light blocking layer is provided.

Hereinafter, other embodiments will be described in detail.

A light blocking layer having improved reliability may be realized by preventing elution of metal ions and accomplishing improved light blocking.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with a substituent including halogen (F, Cl, Br or I), a hydroxyl group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, or a combination thereof, instead of at least one hydrogen of a compound.

As used herein, when a specific definition is not otherwise provided, the terms "heterocycloalkyl group", "heterocycloalkenyl group", "heterocycloalkynyl group", and "heterocycloalkylene group" refer to cycloalkyl, cycloalkenyl, cycloalkynyl, and cycloalkylene, respectively, including at least one heteroatom N, O, S, P, or a combination thereof, in place of a carbon atom of a cyclic group.

As used herein, when a specific definition is not otherwise provided, "(meth)acrylate" refers to both "acrylate" and "methacrylate".

The photosensitive resin composition for a light blocking layer includes (A) a colorant, (B) a binder resin, (C) a photopolymerizable monomer, (D) a photopolymerization initiator, and (E) a solvent.

Hereinafter, each component is described in detail.

(A) Colorant

The colorant according to one embodiment includes a mixture of blue and red materials.

The blue material may be a dye represented by the following Chemical Formula 1.

[Chemical Formula 1]

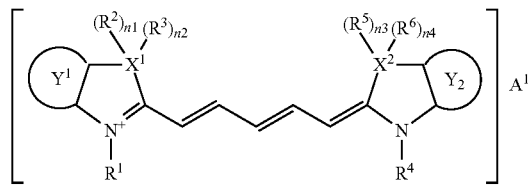

In Chemical Formula 1, $X^1$ and $X^2$ are the same or different and are each independently a carbon atom, a sulfur atom, or an oxygen atom, $R^1$ to $R^6$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, the $Y^1$ cyclic group and $Y^2$ cyclic group are the same or different and are each independently substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, $A^1$ is a halide anion, perhalate anion, tetrafluoroborate anion ($BF_4^-$), a hexafluoroantimonate anion ($SbF_6^-$), a haloacetate anion, an alkylsulfate anion, a sulfonate anion, or a hexafluorophosphate anion ($PF_6^-$), and $n^1$ to $n^4$ are the same or different and are each independently 0 or 1.

As used in the definition of $A^1$, the term alkylsulfate anion may include C1-C18 alkylsulfate anion.

In exemplary embodiments, in Chemical Formula 1, when $X^1$ and $X^2$ are independently a sulfur atom and/or an oxygen atom, $n^1$ to $n^4$ are each 0.

The blue material like a dye represented by Chemical Formula 1 is mixed with the red material and may provide blackness. The blue material including no metal ions may prevent the metal ions from being eluted by a solvent. In addition, the blue material replaces carbon black in the photosensitive resin composition and may provide high insulation and blackness to the photosensitive resin composition.

The dye represented by Chemical Formula 1 may be a dye represented by the following Chemical Formula 2.

[Chemical Formula 2]

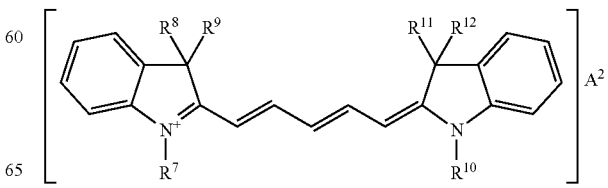

In Chemical Formula 2, $R^7$ to $R^{12}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, and $A^2$ is a halide anion; a perhalate anion such as $ClO_4^-$; a tetrafluoroborate anion ($BF_4^-$); a hexafluoroantimonate anion ($SbF_6^-$); a haloacetate anion such as $CF_3CO_2^-$; an alkylsulfate anion; a sulfonate anion represented by $N(SO_2CF_3)_2$, the following Chemical Formulae 3-1 or 3-2; or a hexafluorophosphate anion ($PF_6^-$).

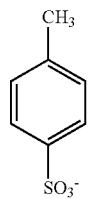

[Chemical Formula 3-1]

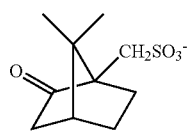

[Chemical Formula 3-2]

The dye represented by Chemical Formula 1 may be a dye represented by the following Chemical Formula 4, but is not limited thereto.

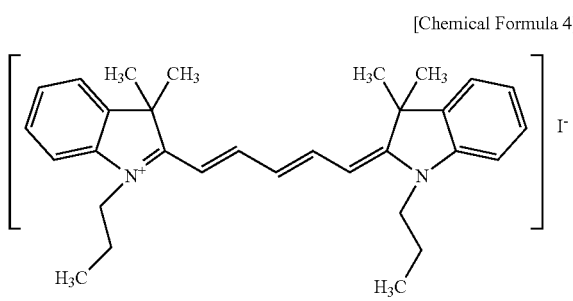

[Chemical Formula 4]

The blue material may include a violet pigment as well as the dye represented by Chemical Formula 1.

Examples of the violet pigment may include without limitation dioxazine violet, first violet B, methyl violet, indanthrene brilliant violet, and the like, and combinations thereof.

The red material may include a dye, a pigment, or a combination thereof. Examples of the red material may include without limitation perylene-based pigments, anthraquinone-based pigments, dianthraquinone-based pigments, azo-based pigments, diazo-based pigments, quinacridone-based pigments, anthracene-based pigments, and the like, and combinations thereof. In exemplary embodiments, the red material may include without limitation perylene pigments, quinacridone pigments, naphthol AS, sicomin pigments, anthraquinones (sudan I, II, III, R), dianthraquinonylates, bis azos, benzopyrane and the like, and combinations thereof.

The blue material and the red material may be mixed in a weight ratio of about 10:90 to about 90:10, for example about 60:40 to about 90:10, and as another example about 75:25 to about 85:15.

In some embodiments, the mixture of the blue material and the red material can include the blue material in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the blue material can be in a range from about any of the foregoing amounts to about any other of the foregoing amounts.

In some embodiments, the mixture of the blue material and the red material can include the red material in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the red material can be in a range from about any of the foregoing amounts to about any other of the foregoing amounts.

When the blue material and the red material are mixed in a weight ratio within the above range, blackness may be realized.

The colorant may further include a green material as well as the blue material and the red material.

The green material may include a dye, a pigment, or a combination. Examples of the green material may include without limitation halogenated phthalocyanine-based pigments, and the like, and combinations thereof. In exemplary embodiments, examples of the green pigment may include without limitation polychloro copper phthalocyanine, polychloro bromo phthalocyanine, and the like, and combinations thereof.

The pigments may be dispersed in a solvent and be included in the photosensitive resin composition for a light blocking layer in a form of a dispersion. Such a pigment dispersion may include the pigments, a solvent, a dispersing agent, a binder resin, and the like.

Examples of the solvent may include without limitation ethylene glycol acetate, ethyl cellosolve, propylene glycol methyl ether acetate, ethyl lactate, polyethylene glycol, cyclohexanone, propylene glycol methyl ether, and the like, and combinations thereof, for example propylene glycol methyl ether acetate.

The dispersing agent helps the pigments uniformly dispersed. Examples of the dispersing agent may include without limitation non-ionic dispersing agents, anionic dispersing agents, cationic dispersing agents, and the like, and combinations thereof. Examples of the dispersing agent may include without limitation polyalkylene glycol or esters thereof, polyoxy alkylene, polyhydric alcohol ester alkylene oxide addition products, alcohol alkylene oxide addition products, sulfonic acid ester, sulfonate salts, carboxylic acid esters, carboxylate salts, alkylamidealkyleneoxide addition products, alkyl amines, and the like. These dispersing agents may be used singularly or as a mixture of two or more.

Examples of the binder resin may include acrylic-based resins having a carboxyl group, and the like, and combinations thereof. In exemplary embodiments, examples of the binder resin may include without limitation esters, carboxylate salts, alkyl amide alkylene oxide addition products, alkyl amines, and the like, and combinations thereof.

The binder resin may improve stability of a pigment dispersion and pattern formation of pixels.

The pigment may have a primary particle diameter of about 10 nm to about 70 nm. When the primary particle diameter falls within the above particle diameter range, stability in a pigment dispersion and pixel resolution can be improved.

In addition, there is no particular limit the secondary particle diameter of the pigment. In exemplary embodiments, the pigment may have a secondary particle diameter of less than or equal to about 200 nm, for example about 70 to about 100 nm, taking into account resolution of pixels.

The photosensitive resin composition cam include the colorant in an amount of about 1 to about 80 wt %, for example about 50 to about 70 wt % based on the total amount of the photosensitive resin composition for a light blocking layer. In some embodiments, the photosensitive resin composition can include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of the colorant can be in a range from about any of the foregoing amounts to about any other of the foregoing amounts.

When the colorant is included in an amount within the above range, blackness may be realized, and reliability of a light blocking layer may be improved.

(B) Binder Resin

Examples of the binder resin may include without limitation cardo-based binder resins, acrylic-based binder resins, polyimide-based binder resins, polyurethane-based binder resins, and the like, and combinations thereof.

The binder resin may have a weight average molecular weight of about 1,000 to about 150,000 g/mol.

In one embodiment, the binder resin may be a cardo-based binder resin. The cardo-based binder resin may improve heat and chemical resistances of the photosensitive resin composition.

The cardo-based binder resin may have a weight average molecular weight of about 1,000 to about 50,000 g/mol, for example about 3,000 to about 35,000 g/mol. When the cardo-based binder resin has a weight average molecular weight within the above range, excellent patterning capability and developability may be provided during the manufacture of a light blocking layer.

The cardo-based binder resin may be a compound including a repeating unit represented by the following Chemical Formula 5.

[Chemical Formula 5]

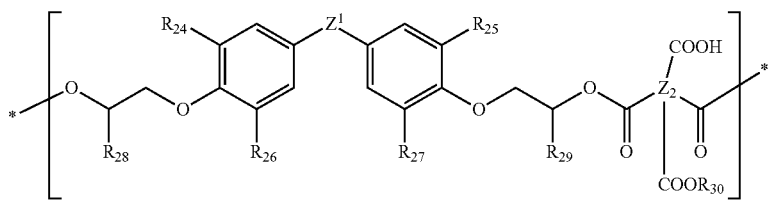

In Chemical Formula 5, $R_{24}$ to $R_{27}$ are the same or different and are each independently hydrogen, halogen, or substituted or unsubstituted C1 to C20 alkyl, $R_{28}$ and $R_{29}$ are the same or different and are each independently hydrogen or $CH_2OR_a$ (wherein $R_a$ is a vinyl group, an acrylate group, or a methacrylate group), $R_{30}$ is hydrogen, substituted or unsubstituted C1 to C20 alkyl, substituted or unsubstituted C2 to C20 alkenyl, an acrylate group, or a methacrylate group, $Z_1$ is a single bond, O, CO, $SO_2$, $CR_bR_c$, $SiR_dR_e$ (wherein $R_b$ to $R_e$ are the same or different and are each independently hydrogen or substituted or unsubstituted C1 to C20 alkyl), or a compound represented by the following Chemical Formulae 6 to 16, and $Z_2$ is an acid anhydride residual group or an acid dianhydride residual group.

[Chemical Formula 6]

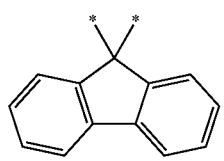

[Chemical Formula 7]

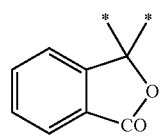

[Chemical Formula 8]

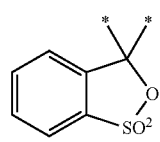

[Chemical Formula 9]

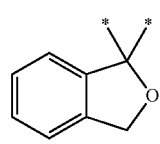

[Chemical Formula 10]

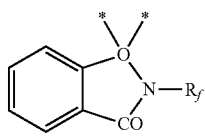

In Chemical Formula 10, $R_f$ is hydrogen, ethyl, $C_2H_4Cl$, $C_2H_4OH$, $CH_2CH=CH_2$, or phenyl.

[Chemical Formula 11]

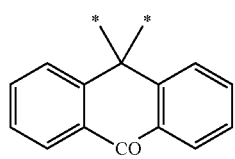

[Chemical Formula 12]

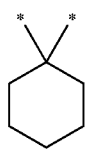

[Chemical Formula 13]

[Chemical Formula 14]

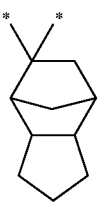

[Chemical Formula 15]

[Chemical Formula 16]

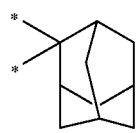

The cardo-based binder resin may be obtained by reacting a compound represented by the following Chemical Formula 17 with tetracarboxylic acid dianhydride.

[Chemical Formula 17]

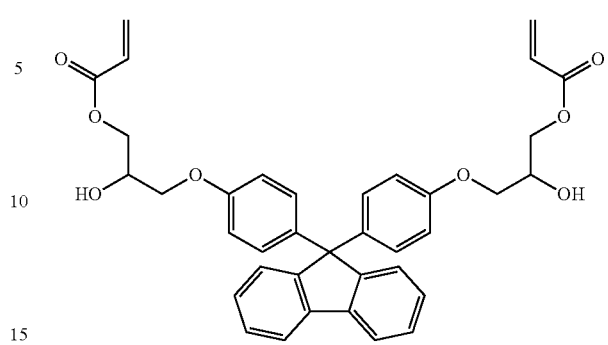

The tetracarboxylic acid dianhydride may be aromatic tetracarboxylic acid dianhydride. Examples of the aromatic tetracarboxylic acid dianhydride may include without limitation pyromellic acid dianhydride, 3,3',4,4'-biphenyltetracarboxylic acid dianhydride, 2,3,3',4-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfonetetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridinetetracarboxylic acid dianhydride, 3,4,9,10-perylenetetracarboxylic acid dianhydride, 2,2-bis(3,4-dicarboxylphenyl)hexafluoropropane dianhydride, and the like, and combinations thereof.

The acrylic-based binder resin can be a copolymer of a first ethylenic unsaturated monomer and a second ethylenic unsaturated monomer that is copolymerizable with the first ethylenic unsaturated monomer and also, includes at least one acrylic-based repeating unit.

The first ethylenic unsaturated monomer is an ethylenic unsaturated monomer including at least one carboxyl group. Examples of the monomer include without limitation acrylic acid, methacrylic acid, maleic acid, itaconic acid, fumaric acid, and the like, and combinations thereof.

The acrylic-based binder resin can include the first ethylenic unsaturated monomer in an amount ranging from about 5 to about 50 wt %, for example, from about 10 to about 40 wt %, based on the total amount (weight) of the acrylic-based binder resin. In some embodiments, the acrylic-based binder resin can include the first ethylenic unsaturated monomer in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, or 50 wt %. Further, according to some embodiments of the present invention, the amount of the first ethylenic unsaturated monomer can be in a range from about any of the foregoing amounts to about any other of the foregoing amounts.

Examples of the second ethylenic unsaturated monomer may include without limitation aromatic vinyl compounds such as styrene, α-methylstyrene, vinyltoluene, vinylbenzylmethylether, and the like; unsaturated carboxylic acid ester compounds such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; unsaturated carboxylic acid amino alkyl ester compounds such as 2-aminoethyl(meth)acrylate, 2-dimethylaminoethyl (meth)acrylate, and the like; carboxylic acid vinyl ester compounds such as vinyl acetate, vinyl benzoate, and the like; unsaturated carboxylic acid glycidyl ester compounds such as glycidyl(meth)acrylate and the like; vinyl cyanide compounds such as (meth)acrylonitrile and the like; unsaturated amide compounds such as (meth)acrylamide and the like; and the like. These may be used singularly or as a mixture of two or more.

Examples of the acrylic-based resin may include without limitation a methacrylic acid/benzylmethacrylate copolymer, a methacrylic acid/benzyl methacrylate/styrene copolymer, a methacrylic acid/benzyl methacrylate/2-hydroxyethylmethacrylate copolymer, a methacrylic acid/benzyl methacrylate/styrene/2-hydroxyethylmethacrylate copolymer, and the like. These may be used singularly or in a mixture of two or more.

The acrylic-based binder resin may have a weight average molecular weight ranging from about 3,000 to about 150,000 g/mol, for example, about 5,000 to about 50,000 g/mol, and as another example, about 2,000 to about 30,000 g/mol. When the acrylic-based binder resin has a weight average molecular weight within the above range, the photosensitive resin composition for a light blocking layer can have good physical and chemical properties, appropriate viscosity, and close contacting (adhesive) properties with a substrate during fabrication of a light blocking layer.

The acrylic-based binder resin may have an acid value of about 15 to about 60 mgKOH/g, for example, about 20 to about 50 mgKOH/g. When the acrylic-based binder resin has an acid value within the above range, excellent pixel resolution may be realized.

The photosensitive resin composition may include the binder resin in an amount of about 0.1 to about 30 wt %, for example, about 1 to about 20 wt %, based on the total amount (weight) of the photosensitive resin composition for a light blocking layer. In some embodiments, the photosensitive resin composition may include the binder resin in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the binder resin can be in a range from about any of the foregoing amounts to about any other of the foregoing amounts.

When the binder resin is included in an amount within the above range, patterning capability, processibility, and developability can be improved during manufacture of the light blocking layer due to appropriate viscosity.

(C) Photopolymerizable Monomer

The photopolymerization monomer may include a multifunctional monomer having two or more hydroxyl groups. Examples of the photopolymerization monomer may include without limitation glycerolacrylate, dipentaerythritolhexaacrylate, ethyleneglycoldiacrylate, triethyleneglycoldiacrylate, 1,4-butanedioldiacrylate, 1,6-hexanedioldiacrylate, neopentylglycoldiacrylate, pentaerythritoldiacrylate, pentaerythritoltriacrylate, pentaerythritol diacrylate, dipentaerythritoltriacrylate, dipentaerythritolacrylate, pentaerythritolhexaacrylate, bisphenolAdiacrylate, trimethylolpropanetriacrylate, novolacepoxyacrylate, ethyleneglycoldimethacrylate, diethyleneglycoldimethacrylate, triethyleneglycoldimethacrylate, propyleneglycoldimethacrylate, 1,4-butanedioldimethacrylate, 1,6-hexanedioldimethacrylate, and the like, and combinations thereof.

The photosensitive resin composition may include the photopolymerization monomer in an amount of about 0.1 to about 30 wt %, for example, about 5 to about 20 wt %, based on the total amount (weight) of the photosensitive resin composition for a light blocking layer. In some embodiments, the photosensitive resin composition may include the photopolymerization monomer in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 wt %. Further, according to some embodiments of the present invention, the amount of the photopolymerization monomer can be in a range from about any of the foregoing amounts to about any other of the foregoing amounts.

When the photopolymerization monomer is included in an amount within the above range, the composition may have excellent pattern characteristics and developing property.

(D) Photopolymerization Initiator

The photopolymerization initiator can be any photopolymerziation initiator known in the art generally used for preparing a photosensitive resin composition. Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-dimethylamino-2-(4-methylbenzyl)-1-(4-morpholin-4-yl-phenyl)-butane-1-one, and the like, and combinations thereof.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphtol-yl)-4,6-bis(trichloromethyl)-s-triazine, 2-4-tri chloromethyl(piperonyl)-6-triazine, 2-4-trichloromethyl(4'-methoxystyryl)-6-triazine, and the like, and combinations thereof.

Examples of the oxime-based compound may include without limitation 1,2-octandione, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof.

Other examples of the photopolymerization initiator may include without limitation carbazole-based compounds, diketone-based compounds, sulfonium borate-based compounds, diazo-based compounds, nonimidazole-based compounds, and the like, and combinations thereof, in addition to or instead of the aforementioned photopolymerization initiators.

The photosensitive resin composition may include the photopolymerization initiator in an amount of about 0.1 to about 5 wt %, for example, about 1 to about 3 wt %, based on the total amount (weight) of photosensitive resin composition for a light blocking layer. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, or 5 wt %. Further, according to some embodiments of the present invention, the amount of the photopolymerization initiator can be in a range from about any of the foregoing amounts to about any other of the foregoing amounts.

When the photopolymerization initiator is included in an amount within the above range, the composition may be sufficiently photopolymerized when exposed to a light during manufacture of a light blocking layer, which can provide excellent sensitivity and improve transmittance.

(E) Solvent

The solvent is not specifically limited. Examples of the solvent include without limitation alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid alkyl esters such as methyl lactate, ethyl lactate, and the like; hydroxyacetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methyl-propionate, and the like; esters such as 2-hydroxyethyl propionate, 2-hydroxy-2-methylethyl propionate, hydroxyethyl acetate, methyl 2-hydroxy-3-methylbutanoate, and the like; or ketonic acid esters such as ethyl pyruvate. Furthermore, the solvent may be N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like. These solvents may be used singularly or in a mixture thereof.

In exemplary embodiments, taking into account miscibility, reactivity, and the like, the solvent may include without limitation glycol ethers such as ethylene glycol monoethyl ether and the like; ethylene glycol alkylether acetates such as ethyl cellosolve acetate and the like; esters such as 2-hydroxy ethyl propionate and the like; diethylene glycols such as diethylene glycol monomethyl ether and the like; or propylene glycol alkylether acetates such as propylene glycol monomethylether acetate, propylene glycol propylether acetate, and the like, and combinations thereof.

The photosensitive resin composition may include the solvent in a balance amount, for example, in an amount ranging from 20 to 90 wt % based on the total amount (weight) of the photosensitive resin composition for a light blocking layer. In some embodiments, the photosensitive resin composition may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts.

When the solvent is included in an amount within the above range, the photosensitive resin composition may have excellent coating properties and may maintain excellent flatness in a layer having a thickness of greater than or equal to about 3 μm.

(F) Other Additive(s)

The photosensitive resin composition may further include one or more additives. Examples of the additives include without limitation malonic acid; 3-amino-1,2-propanediol; silane-based coupling agents with a vinyl group or a (meth) acryloxy group; leveling agents; fluorine-based surfactants; radical polymerization initiators; and the like, and combinations thereof. The additives can help prevent stains or spots during the coating, prevent generation of a residue due to non-development and/or control leveling.

Examples of the silane-based coupling agent may include without limitation trimethoxysilyl benzoic acid, γ-methacryl oxypropyl trimethoxysilane, vinyl triacetoxysilane, vinyl trimethoxysilane, γ-iso cyanate propyl triethoxysilane, γ-glycidoxy propyl trimethoxysilane, β-(3,4-epoxycyclohexyl)ethyltrimethoxysilane, and the like. These coupling agents may be used singularly or in a mixture of two or more.

Examples of the fluorine-based surfactant may include without limitation BM-1000®, and BM-1100® (BM Chemie Inc.); MEGAFACE F 142D®, F 172®, F 173®, and F 183® (Dainippon Ink & Chemicals (DIC), Inc.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (Asahi Glass Co., Ltd.); and SH-28PA®, SH-190®, SH-193®, SZ-6032®, and SF-8428®, and the like (Toray Silicone Co., Ltd.), and the like, and combinations thereof.

The amounts of the additive(s) may be easily adjusted depending on desired properties.

According to another embodiment, provided is a light blocking layer manufactured using the photosensitive resin composition for a light blocking layer. The light blocking layer may be manufactured as follows.

(1) Coating and Film Formation

The photosensitive resin composition for a light blocking layer can be coated to have a desired thickness, for example, a thickness ranging from about 0.9 to about 4.0 μm, on a substrate which undergoes a predetermined pretreatment, using a spin or slit coating method, a roll coating method, a screen-printing method, an applicator method, and the like. Then, the coated substrate can be heated at a temperature ranging from about 70 to about 90° C. for about 1 to about 10 minutes to remove a solvent.

(2) Exposure

The resultant film can be radiated by an active ray of about 200 to about 500 nm after putting a mask with a predetermined shape to form a desired pattern.

The radiation can be performed by using a light source such as a mercury lamp with a low pressure, a high pressure, or an ultrahigh pressure, a metal halide lamp, an argon gas laser, and the like. An X ray, an electron beam, and the like may be also used.

The exposure may be performed by using, for example, a light dose of about 500 mJ/cm$^2$ or less (with a about 365 nm sensor) when a high pressure mercury lamp is used. However, the light dose may vary depending on the kinds of each component of the photosensitive resin composition for a light blocking layer, its combination ratio, and thickness of a dry film and can be readily determined by the skilled artisan without undue experimentation.

(3) Development

After the exposure, an image pattern can be formed by using an alkali aqueous solution to develop the exposed film to dissolve and remove an unnecessary part except for the exposed part.

(4) Post-Treatment

The developed image pattern may be heated again or radiated by an active ray and the like for curing, in order to accomplish excellent quality in terms of heat resistance, photo resistance, close contacting (adhesion) properties, crack-resistance, chemical resistance, high strength, storage stability, and the like.

Hereinafter, the present invention is illustrated in more detail with reference to examples. However, these are exemplary embodiments, and the present invention is not limited thereto.

(Preparation of Photosensitive Resin Composition for Light Blocking Layer)

The photosensitive resin compositions for a light blocking layer are prepared by using the following components.

(A) Colorant (A-1) Blue Material (A-1-1) A dye represented by the following Chemical Formula 4 (cyan-1, KISCO) is used.

[Chemical Formula 4]

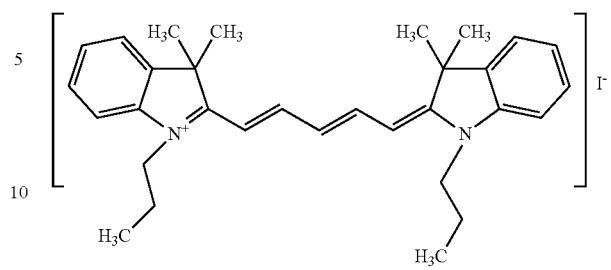

(A-1-2) A mill base (Sakata Co. Ltd.) including a pigment, V23, made by BASF Co. is used.

(A-1-3) A mill base (Sakata Co. Ltd.) including a pigment, B15:6, represented by the following Chemical Formula 18 and made by BASF Co. is used.

[Chemical Formula 18]

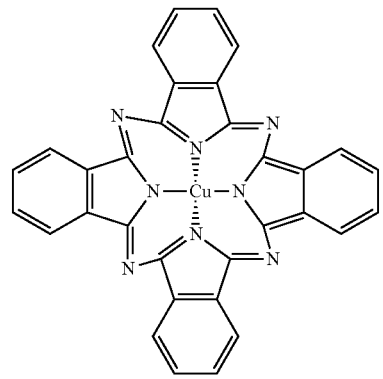

(A-2) Red Material
Orange 63 (Sakata Co. Ltd.) is used.
(B) Binder Resin
V259ME made by NSCC as a cardo-based binder resin is used.
(C) Photopolymerizable Monomer
Dipentaerythritolhexaacrylate is used.
(D) Photopolymerization Initiator
IGR 369 made by Ciba-Geigy Co. is used.
(E) Solvent
Propylene glycol methylether acetate is used.
(F) Additive
γ-glycidoxy propyl trimethoxysilane (S-710, Chisso Corp.) is used.

Examples 1 and 2 and Comparative Example 1

Photosensitive resin compositions for a light blocking layer are prepared by mixing each component according to the composition provided in the following Table 1. Specifically, a photopolymerization initiator is dissolved in a solvent, and the solution is agitated for 30 minutes. Then, a binder resin and a photopolymerizable monomer are sequentially added thereto. The mixture is agitated for one hour. Then, an additive is added to the agitated mixture, and a colorant is finally added thereto. The resulting mixture is agitated for greater than or equal to 2 hours, preparing photosensitive resin compositions for a light blocking layer.

TABLE 1

(unit: wt %)

| | | | Example 1 | Example 2 | Comparative Example 1 |
|---|---|---|---|---|---|
| (A) colorant | (A-1) blue material | (A-1-1) | 3.85 | 4.71 | — |
| | | (A-1-2) | 3.85 | 2.99 | 2.99 |
| | | (A-1-3) | — | — | 4.71 |
| | (A-2) red material | | 0.86 | 0.86 | 0.86 |
| (B) binder resin | | | 2.56 | 2.56 | 2.56 |
| (C) photopolymerizable monomer | | | 1.10 | 1.10 | 1.10 |
| (D) photopolymerization initiator | | | 0.69 | 0.69 | 0.69 |
| (E) solvent | | | 86.80 | 86.80 | 86.80 |
| (F) additive | | | 0.29 | 0.29 | 0.29 |

Evaluation 1: Elution of Metal Ion

Each photosensitive resin composition for a light blocking layer according to Examples 1 and 2 and Comparative Example 1 is respectively coated to be 2.0 μm thick on a predeterminedly pretreated substrate and then, heated at 90° C. for 4 minutes to remove the solvent, forming films on the substrates. Next, a photomask is put on the films and exposed to a light with 40 mJ. Then, the substrates having the films thereon are baked at 220° C. in a convection oven for 25 minutes. The obtained film specimens are put in 4 mL of 100° C. N-methylpyrrolidone for 10 minute to elute Cu. Then, 0.2 g of the film specimens are put in 30 time-diluted N-methylpyrrolidone using ICP-MS, and the elution of Cu ions is measured. The results are provided in the following Table 2.

Evaluation 2: Liquid Crystal Reaction Value

The photosensitive resin compositions for a light blocking layer according to Examples 1 and 2 and Comparative Example 1 are respectively coated on a glass substrate to form a film thereon. The film samples are put into liquid crystal and aged at 80° C. for 2 hours. The liquid crystal is injected between two electrodes, and a voltage is applied thereto, fabricating device samples. The device samples are evaluated for contamination degrees of the liquid crystal by measuring a liquid crystal reaction value with autronic VHRM. The results are provided in the following Table 2.

Evaluation 3: VHR

The photosensitive resin compositions for a light blocking layer according to Examples 1 and 2 and Comparative Example 1 are respectively coated on ITO-patterned glass substrates, forming film specimens. The film specimens are respectively assembled and compressed with an ITO-patterned electrode, and liquid crystals are injected therebetween and then, sealed, fabricating device samples. The sample devices are measured regarding VHR with autronic VHRM. The results are provided in the following Table 2.

TABLE 2

| | Elution of Cu ion (pg/cm$^2$) | Liquid crystal reaction value (%) | VHR (%) |
|---|---|---|---|
| Example 1 | 0.0 | 95 | 97 |
| Example 2 | 0.0 | 95 | 97 |
| Comparative Example 1 | 5625.2 | 75 | 82 |

Referring to Table 2, Examples 1 and 2 using the photosensitive resin compositions for a light blocking layer prepared by mixing blue and red materials as two colorants have no metal ion elution compared with Comparative Example 1 using a photosensitive resin composition prepared using a blue material including metal ions and thus, prevented deterioration of liquid crystal and accomplished excellent light proofness.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a light blocking layer, comprising:
   (A) a colorant including a blue material including a dye represented by the following Chemical Formula 1 and a red material, wherein the colorant comprises the dye represented by Chemical Formula 1 and the red material in a weight ratio of about 10:90 to about 90:10;
   (B) a binder resin;
   (C) a photopolymerizable monomer;
   (D) a photopolymerization initiator; and
   (E) a solvent:

[Chemical Formula 1]

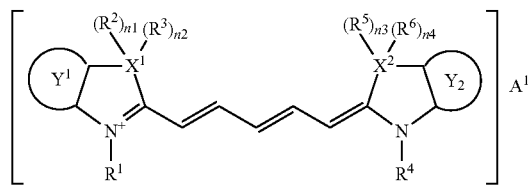

wherein, in Chemical Formula 1,
$X^1$ and $X^2$ are the same or different and are each independently a carbon atom, a sulfur atom, or an oxygen atom,
$R^1$ to $R^6$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl,
$Y^1$ cyclic group and $Y^2$ cyclic group are the same or different and are each independently substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl,
$A^1$ is a halide anion, perhalate anion, tetrafluoroborate anion ($BF_4^-$), a hexafluoroantimonate anion ($SbF_6^-$), a haloacetate anion, an alkylsulfate anion, a sulfonate anion, or a hexafluorophosphate anion ($PF_6^-$), and n¹ to n⁴ are the same or different and are each independently 0 or 1.

2. The photosensitive resin composition for a light blocking layer of claim 1, wherein the dye represented by the Chemical Formula 1 comprises a dye represented by the following Chemical Formula 2:

[Chemical Formula 2]

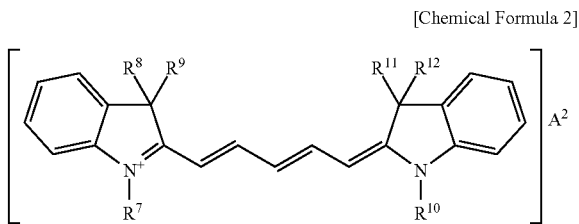

wherein, in Chemical Formula 2, $R^7$ to $R^{12}$ are the same or different and are each independently hydrogen, substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C2 to C20 heterocycloalkyl, substituted or unsubstituted C2 to C20 heterocycloalkenyl, substituted or unsubstituted C2 to C20 heterocycloalkynyl, substituted or unsubstituted C6 to C30 aryl, or substituted or unsubstituted C2 to C30 heteroaryl, and $A^2$ is a halide anion, a perhalate anion, a tetrafluoroborate anion ($BF_4^-$), a hexafluoroantimonate anion ($SbF_6^-$), a haloacetate anion, an alkylsulfate anion, a sulfonate anion, or a hexafluorophosphate anion ($PF_6^-$).

3. The photosensitive resin composition for a light blocking layer of claim 1, wherein the blue material further comprises a violet pigment.

4. The photosensitive resin composition for a light blocking layer of claim 1, wherein the red material comprises a dye, a pigment, or a combination thereof.

5. The photosensitive resin composition for a light blocking layer of claim 1, wherein the red material comprises a perylene-based pigment, an anthraquinone-based pigment, a dianthraquinone-based pigment, an azo-based pigment, a diazo-based pigment, a quinacridone-based pigment, an anthracene-based pigment, or a combination thereof.

6. The photosensitive resin composition for a light blocking layer of claim 1, wherein the colorant further comprises a green material.

7. The photosensitive resin composition for a light blocking layer of claim 6, wherein the green material comprises a dye, a pigment, or a combination thereof.

8. The photosensitive resin composition for a light blocking layer of claim 6, wherein the green material comprises a halogenated phthalocyanine-based pigment.

9. The photosensitive resin composition for a light blocking layer of claim 1, wherein the photosensitive resin composition for a light blocking layer comprises:

about 1 to about 80 wt % of the colorant (A);

about 0.1 to about 30 wt % of the binder resin (B);

about 0.1 to about 30 wt % of the photopolymerizable monomer (C);

about 0.1 to about 5 wt % of the photopolymerization initiator (D); and a balance amount of the solvent (E).

10. A light blocking layer manufactured using the photosensitive resin composition for a light blocking layer of claim 1.

* * * * *